(12) United States Patent
Han et al.

(10) Patent No.: US 10,923,452 B2
(45) Date of Patent: Feb. 16, 2021

(54) SUBSTRATE BONDING APPARATUS

(71) Applicant: SAMSUNG ELECTRONICS CO., LTD., Suwon-si (KR)

(72) Inventors: Ilyoung Han, Suwon-si (KR); Taeyeong Kim, Suwon-si (KR); Jihoon Kang, Suwon-si (KR); Nohsung Kwak, Suwon-si (KR); Seokho Kim, Suwon-si (KR); Hoechul Kim, Suwon-si (KR); Ilhyoung Lee, Suwon-si (KR); Hakjun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/783,342

(22) Filed: Feb. 6, 2020

(65) Prior Publication Data
US 2020/0373274 A1 Nov. 26, 2020

(30) Foreign Application Priority Data
May 20, 2019 (KR) .................. 10-2019-0059134

(51) Int. Cl.
*H01L 23/00* (2006.01)
*H01L 21/67* (2006.01)
(Continued)

(52) U.S. Cl.
CPC ........ *H01L 24/74* (2013.01); *H01L 21/67259* (2013.01); *H01L 21/687* (2013.01); *H01L 21/6838* (2013.01)

(58) Field of Classification Search
CPC ............... H01L 24/74; H01L 21/67259; H01L 21/6838; H01L 21/687; H01L 21/67288; H01L 23/544; H01L 2224/79304; H01L 2224/76304; H01L 2224/75304; H01L 2224/75901; H01L 2224/75745;
(Continued)

(56) References Cited

U.S. PATENT DOCUMENTS 5,129,827 A 7/1992 Hoshi et al.
8,946,797 B2 2/2015 Mizuta et al.
(Continued)

*Primary Examiner* — George R Koch
(74) *Attorney, Agent, or Firm* — Sughrue Mion, PLLC

(57) ABSTRACT

A substrate bonding apparatus for bonding a first substrate to a second substrate includes: a first bonding chuck including: a first base; a first deformable plate provided on the first base to support the first substrate; and a first pneumatic adjustor configured to deform the first deformable plate by adjusting a first pressure in a first cavity formed between the first deformable plate and the first base; and a second bonding chuck including: a second base; a second deformable plate provided on the second base to support the second substrate; and a second pneumatic adjustor configured to deform the second deformable plate by adjusting a second pressure in a second cavity formed between the second deformable plate and the second base. The first deformable plate is deformed such that a first distance between the first base and the first deformable plate is varied based on the first pressure, and the second deformable plate is deformed such that a second distance between the second base the second deformable plate is varied based on the second pressure.

20 Claims, 21 Drawing Sheets

(51) Int. Cl.
*H01L 21/687* (2006.01)
*H01L 21/683* (2006.01)

(58) Field of Classification Search
CPC . H01L 2224/75744; H01L 2224/75743; H01L 24/80
See application file for complete search history.

(56) References Cited

U.S. PATENT DOCUMENTS

| | | |
|---|---|---|
| 9,490,158 B2 | 11/2016 | Huang et al. |
| 9,837,291 B2 | 12/2017 | Huang et al. |
| 2009/0317960 A1* | 12/2009 | Izumi .................. H01L 24/80 438/455 |
| 2012/0264354 A1* | 10/2012 | Liao .................... B24B 49/10 451/6 |
| 2015/0210057 A1* | 7/2015 | Wagenleithner .... B32B 37/0076 156/290 |
| 2017/0178931 A1 | 6/2017 | Choi et al. |
| 2017/0221856 A1 | 8/2017 | Yamauchi |

\* cited by examiner

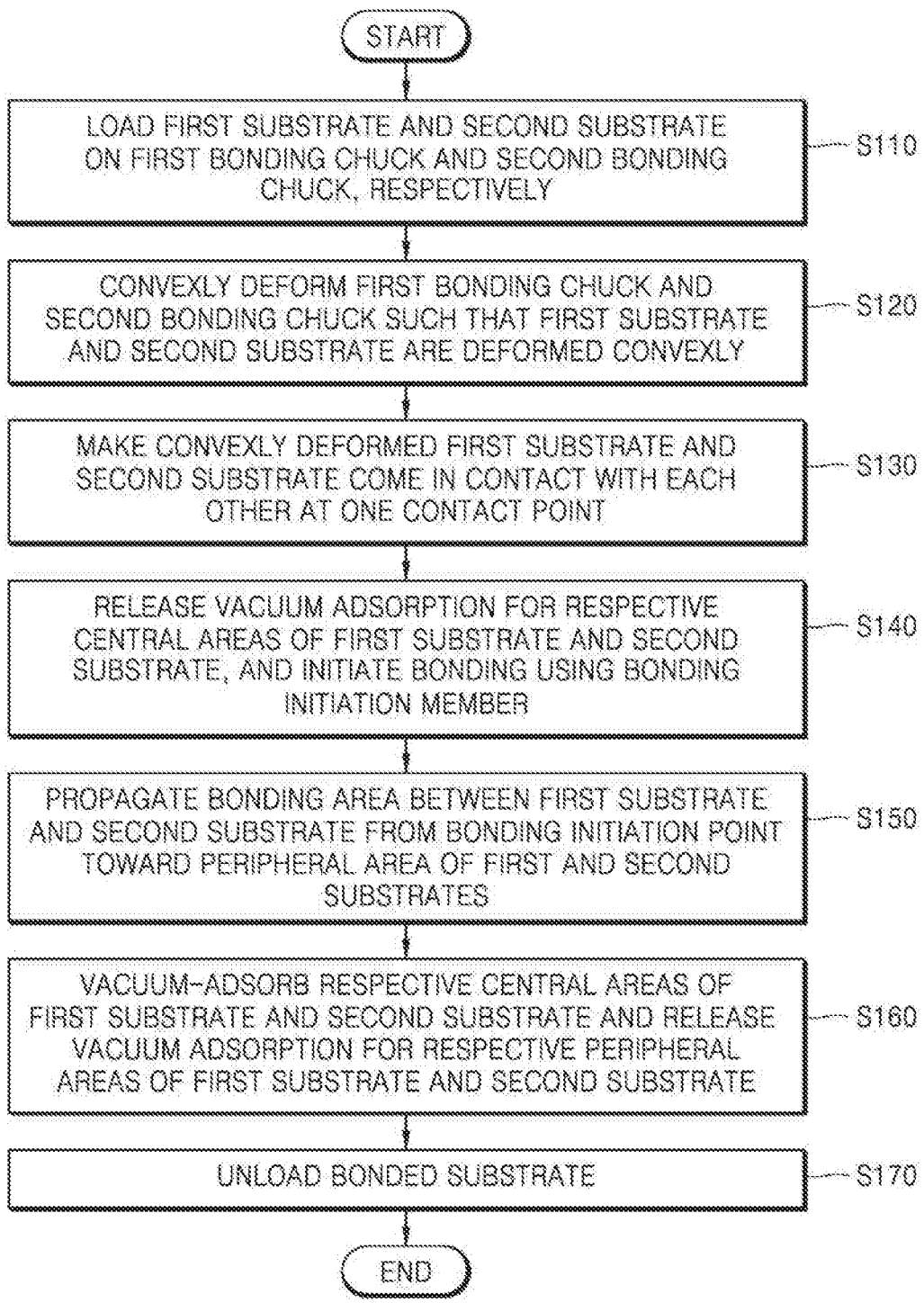

FIG. 2A
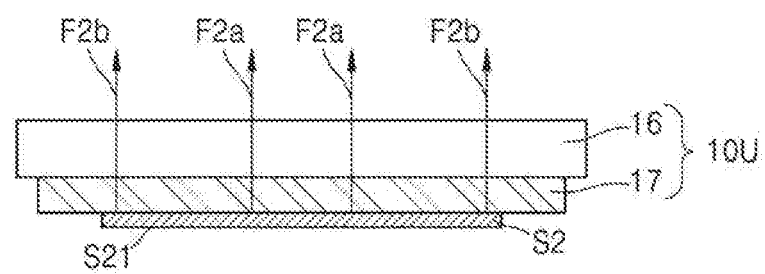
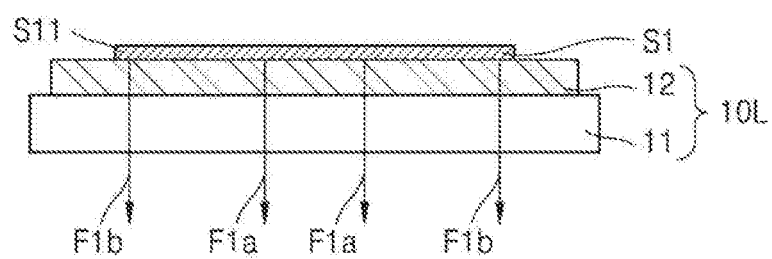

SUBSTRATE BONDING APPARATUS

CROSS-REFERENCE TO RELATED APPLICATION

This application claims priority from Korean Patent Application No. 10-2019-0059134, filed on May 20, 2019 in the Korean Intellectual Property Office, the disclosure of which is incorporated herein by reference in its entirety.

BACKGROUND

Apparatuses consistent with example embodiments relate to a substrate bonding apparatus, and more particularly, to a substrate bonding apparatus improving the reliability of a bonding process of substrates.

In a process of manufacturing a semiconductor device, a substrate bonding process of bonding two or more substrates with each other may be performed. This substrate bonding process may be performed to improve a semiconductor chip mounting density in a semiconductor device. For example, a semiconductor module having a structure in which semiconductor chips are stacked may be advantageous in reduction of a wiring length between the semiconductor chips and may provide high-speed signal processing together with the improvement of the semiconductor chip mounting density.

When a semiconductor module of a stacked semiconductor chip structure is manufactured, productivity may be increased in a process of bonding wafers and then cutting a stacked semiconductor chip. The substrate bonding process may be performed in a wafer to wafer scheme of directly bonding two wafers without a separate medium therebetween. The wafer to wafer scheme may be commonly performed using a bonding apparatus including a bonding chuck supporting a wafer and a component pressing the wafer.

SUMMARY

One or more example embodiments provide a substrate bonding apparatus improving the reliability of a bonding process.

According to an aspect of an example embodiment, there is provided a substrate bonding apparatus for bonding a first substrate to a second substrate including: a first bonding chuck including: a first base; a first deformable plate provided on the first base to support the first substrate; and a first pneumatic adjustor configured to deform the first deformable plate by adjusting a first pressure in a first cavity formed between the first deformable plate and the first base; and a second bonding chuck including: a second base; a second deformable plate provided on the second base to support the second substrate; and a second pneumatic adjustor configured to deform the second deformable plate by adjusting a second pressure in a second cavity formed between the second deformable plate and the second base. The first deformable plate is deformed such that a first distance between the first base and the first deformable plate is varied based on the first pressure, and the second deformable plate is deformed such that a second distance between the second base the second deformable plate is varied based on the second pressure.

According to an aspect of another example embodiment, there is provided a substrate bonding apparatus for bonding a first substrate to a second substrate including: a first bonding chuck including: a first base; and a first deformable plate provided on the first base, the first deformable plate being configured to deform the first substrate by being deformed while supporting the first substrate; and a second bonding chuck including: a second base; and a second deformable plate provided on the second base, the second deformable plate being configured to deform the second substrate by being deformed while supporting the second substrate. The first deformable plate includes a first partition separating a first inner space corresponding to a first central area of the first substrate from a first outer space corresponding to a first peripheral area of the first substrate. The second deformable plate includes a second partition separating a second inner space corresponding to a second central area of the second substrate from a second outer space corresponding to a second peripheral area of the second substrate. The first bonding chuck is configured to independently adjust an a first adsorption force to be applied to the first central area and the first peripheral area of the first substrate, and the second bonding chuck is configured to independently adjust an a second adsorption force to be applied to the second central area and the second peripheral area of the second substrate.

According to an aspect of another example embodiment, there is provided a substrate bonding apparatus for bonding a first substrate to a second substrate including: a first bonding chuck including: a first base; and a first deformable plate provided on the first base to support the first substrate; and a second bonding chuck including: a second base; and a second deformable plate provided on the second base to support the second substrate. The first bonding chuck further includes a first push rod configured to deform the first deformable plate by physically pressing the first deformable plate. The second bonding chuck further includes a second push rod configured to deform the second deformable plate by physically pressing the second deformable plate.

BRIEF DESCRIPTION OF THE DRAWINGS

Example embodiments of the disclosure will be more clearly understood from the following detailed description taken in conjunction with the accompanying drawings in which:

FIG. 1 is a flowchart of a substrate bonding method according to an example embodiment;

FIGS. 2A to 2G are cross-sectional views sequentially illustrating a substrate bonding method using a substrate bonding apparatus, according to an example embodiment;

DETAILED DESCRIPTION

Figure 2B:
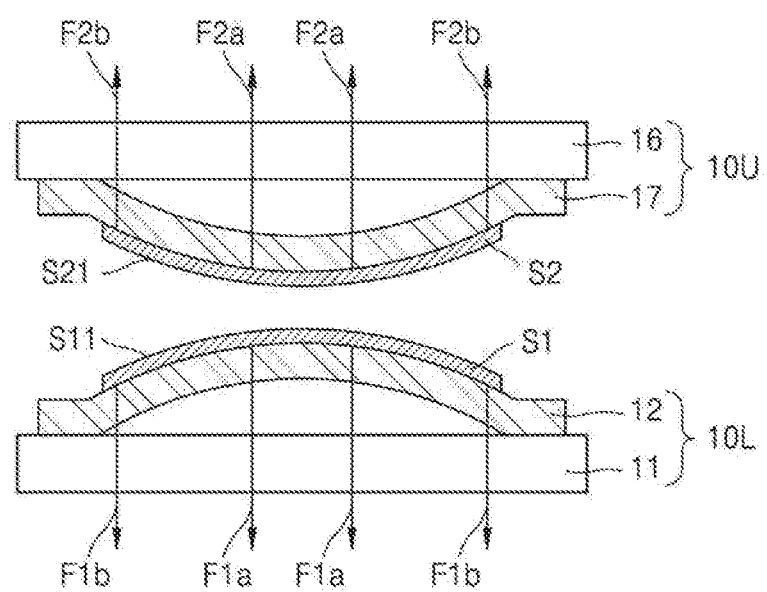

Hereinafter, example embodiments will be described in detail with reference to the accompanying drawings. Like reference numerals are used to refer to like elements through at the drawings, and thus their repetitive description will be omitted.

FIG. 1 is a flowchart of a substrate bonding method according to an example embodiment. FIGS. 2A to 2G are cross-sectional views sequentially illustrating the substrate bonding method using a substrate bonding apparatus, according to an example embodiment.

Referring to FIGS. 1 and 2A to 2G, the substrate bonding method according to an example embodiment may include the operations of: loading a first substrate S1 and a second substrate S2 on a first bonding chuck 10L and a second bonding chuck 10U, respectively (S110); convexly deforming the first bonding chuck 10L and the second bonding chuck 10U toward each other so as to convexly deform the first substrate S1 and the second substrate S2 (S120) toward each other; making the convexly deformed first substrate S1 and second substrate S2 come in contact with each other at one contact point (S130); releasing vacuum adsorption for respective central areas of the first substrate S1 and the second substrate S2, and initiating bonding using a bonding initiation member 19 (S140); propagating a bonding area of the first substrate S1 and the second substrate S2 from a bonding initiation point toward a peripheral area of the first and second substrates S1 and S2 (S150); vacuum-adsorbing the respective central areas of the first substrate S1 and the second substrate S2 and releasing the vacuum adsorption for respective peripheral areas of the first substrate S1 and the second substrate S2 (S160); and releasing the vacuum adsorption for respective peripheral areas of the first substrate S1 and the second substrate S2 and unloading a bonded substrate (S170).

Hereinafter, the substrate bonding method using a substrate bonding apparatus, according to an example embodiment, will be described in detail with reference to FIGS. 1 and 2A to 2G. In FIGS. 2A to 2G, reference numeral "F1a" denotes a vacuum adsorption force applied to the central area of the first substrate S1, reference numeral "F1b" denotes a vacuum adsorption force applied to the peripheral area of the first substrate S1, reference numeral "F2a" denotes a vacuum adsorption force applied to the central area of the second substrate S2, and reference numeral "F2b" denotes a vacuum adsorption force applied to the peripheral area of the second substrate S2.

First, referring to FIGS. 1 and 2A, in operation S110, the first substrate S1 and the second substrate S2 are loaded on the first bonding chuck 10L and the second bonding chuck 10U, respectively. The first bonding chuck 10L may be a lower bonding chuck, and the second bonding chuck 10U may be an upper bonding chuck provided over the first bonding chuck 10L (the lower bonding chuck). The first substrate S1 may be loaded on the first bonding chuck 10L such that an inactive surface of the first substrate S1 comes in contact with the first bonding chuck 10L, and the second substrate S2 may be loaded on the second bonding chuck 10U such that an inactive surface of the second substrate S2 comes in contact with the second bonding chuck 10U. A second bonding surface S21 of the second substrate S2 loaded on the second bonding chuck 10U may face a first bonding surface S11 of the first substrate S1 loaded on the first bonding chuck 10L.

The first bonding chuck 10L may vacuum-adsorb the first substrate S1 so as to adsorb the first substrate S1 thereto, and the second bonding chuck 10U may vacuum-adsorb the second substrate S2 so as to adsorb the second substrate S2 thereto.

According to another example embodiments, each of the first bonding chuck 10L and the second bonding chuck 10U may be configured to support a substrate in a mechanical manner or by using a electrostatic force.

Next, referring to FIGS. 1 and 2B, in operation S120, the first bonding chuck 10L and the second bonding chuck 10U are convexly deformed so as to convexly deform the first substrate S1 and the second substrate S2 adsorbed thereto.

The first bonding chuck 10L may include a first base 11 and a first deformable plate 12 mounted on the first base 11. The outer circumference portion of the first deformable plate 12 may be fixedly attached to the first base 11 by a clamp, wherein an inner portion of the first deformable plate 12 may be convexly deformed by an external force. In a state in which the first substrate S1 is vacuum-adsorbed to the first deformable plate 12, the first deformable plate 12 may be convexly deformed outwardly to forcibly deform the first substrate S1 such that the first substrate S1 has a convex shape toward the second substrate S2. A curvature of the forcibly deformed first substrate S1 may be varied according to a curvature of the first deformable plate 12.

The second bonding chuck 10U may include a second base 16 and a second deformable plate 17 mounted on the second base 16. The outer circumference portion of the second deformable plate 17 may be fixedly attached to the second base 16 by, for example, a clamp, and an inner portion of the second deformable plate 17 may be convexly deformed by an external force. In a state in which the second substrate S2 is vacuum-adsorbed to the second deformable plate 17, the second deformable plate 17 may be convexly deformed to forcibly deform the second substrate S2 such that the second substrate S2 has a convex shape protruding toward the first substrate S1. A curvature of the forcibly deformed second substrate S2 may be varied according to a curvature of the second deformable plate 17.

The deformation of the first deformable plate 12 may be symmetrical to the deformation of the second deformable plate 17. That is, the curvature of the first deformable plate 12 may be symmetrical to the curvature of the second deformable plate 17.

According to an example embodiment, the first deformable plate 12 may be deformed by pneumatic pressure in a first cavity formed between the first deformable plate 12 and the first base 11, and the second deformable plate 17 may be deformed by pneumatic pressure in a second cavity formed between the second deformable plate 17 and the second base 16. The first deformable plate 12 and the second deformable plate 17 may be deformed so as to have a vertically symmetrical shape by controlling the pneumatic pressure in the first cavity to be the same as the pneumatic pressure in the second cavity.

According to an example embodiment, each of the first deformable plate 12 and the second deformable plate 17 may be deformed by being physically pressed. For example, the first deformable plate 12 may be deformed by a first push rod pressing the first deformable plate 12 toward the second deformable plate 17, and the second deformable plate 17 may be deformed by a second push rod pressing the second deformable plate 17 toward the first deformable plate 12. In this case, the first deformable plate 12 and the second deformable plate 17 may be deformed so as to have a vertically symmetrical shape by controlling a force pressing the first deformable plate 12 to be the same as a force pressing the second deformable plate 17.

Because the deformation of the first deformable plate 12 is symmetrical to the deformation of the second deformable plate 17, the forcibly deformed first substrate S1 and second substrate S2 may also be symmetrically deformed. For example, each of the first bonding surface S11 of the forcibly deformed first substrate S1 and the second bonding surface S21 of the forcibly deformed second substrate S2 may be a curved surface, and the curved surface of the first bonding surface S11 and the curved surface of the second bonding surface S21 may be vertically symmetrical. In addition, a curvature of the first bonding surface S11 of the deformed first substrate S1 may be the same as a curvature of the second bonding surface S21 of the deformed second substrate S2. A curvature at one point of the first bonding surface S11 of the first substrate S1 may be the same as a curvature at one point of the second bonding surface S21 of the second substrate S2, the one point of the first bonding surface S11 being vertically symmetrical to the one point of the second bonding surface S21.

According to an example embodiment, the substrate bonding apparatus may include a sensor configured to measure at least one of a displacement of the first deformable plate 12 and a displacement of the second deformable plate 17. The substrate bonding apparatus may deform the first deformable plate 12 and the second deformable plate 17 so as to be symmetrical to each other, based on at least one of the displacement of the first deformable plate 12 and the displacement of the second deformable plate 17, which are measured by the sensor.

Figure 2C:
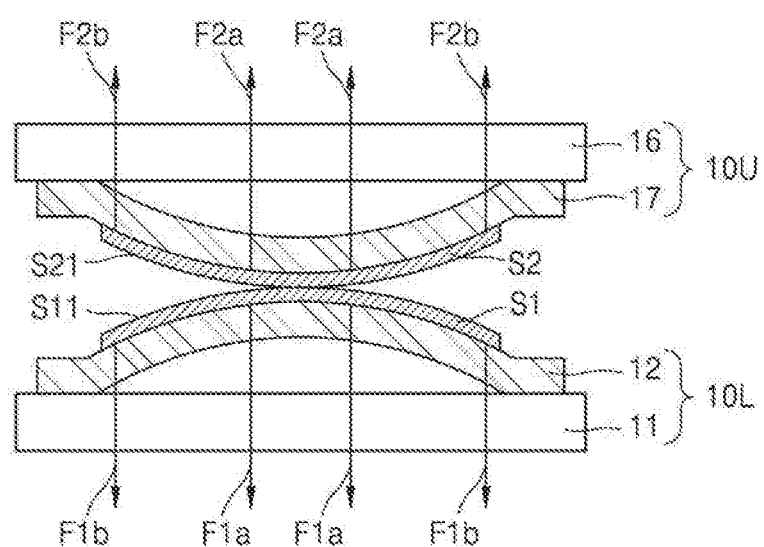

Next, referring to FIGS. 1 and 2C, in operation S130, the convexly deformed first substrate S1 and second substrate S2 are made to come in contact with each other at one contact point. For example, the second substrate S2 may be lowered until the one point of the second bonding surface S21 comes in contact with the one point of the first bonding surface S11. Alternatively, to make the first substrate S1 and the second substrate S2 come in contact with each other, the first substrate S1 may be raised, or both the first substrate S1 and the second substrate S2 may be raised and lowered, respectively.

Figure 2D:
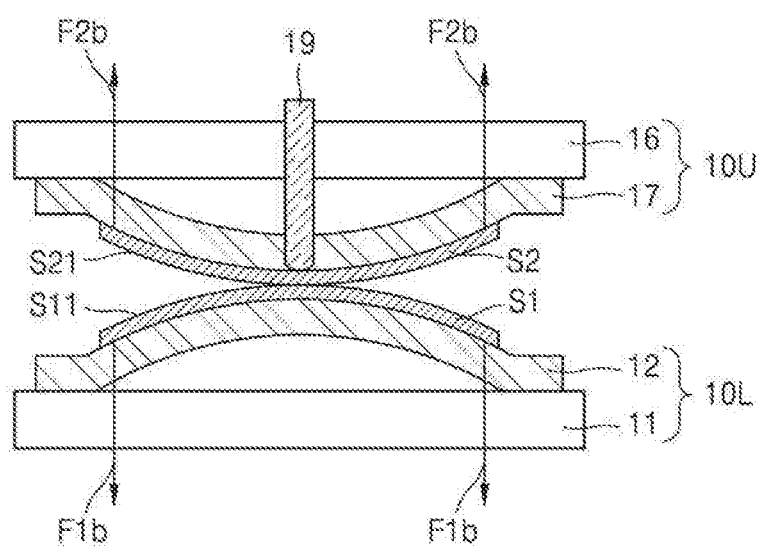

Next, referring to FIGS. 1 and 2D, in operation S140, vacuum adsorption for the respective central areas of the first substrate S1 and the second substrate S2 is released, and bonding is initiated using the bonding initiation member 19. The bonding initiation member 19 may press the contact point between the first substrate S1 and the second substrate S2 such that the first substrate S1 is bonded to the second substrate S2 at the contact point. For example, the bonding initiation member 19 may be configured to penetrate the second deformable plate 17 and press the center of the second substrate S2. The contact point may be defined as a bonding initiation point at which bonding of the first substrate S1 and the second substrate S2 is initiated. For example, the bonding initiation point may be a point at which the center of the first bonding surface S11 of the first substrate S1 meets the center of the second bonding surface S21 of the second substrate S2.

Figure 2E:
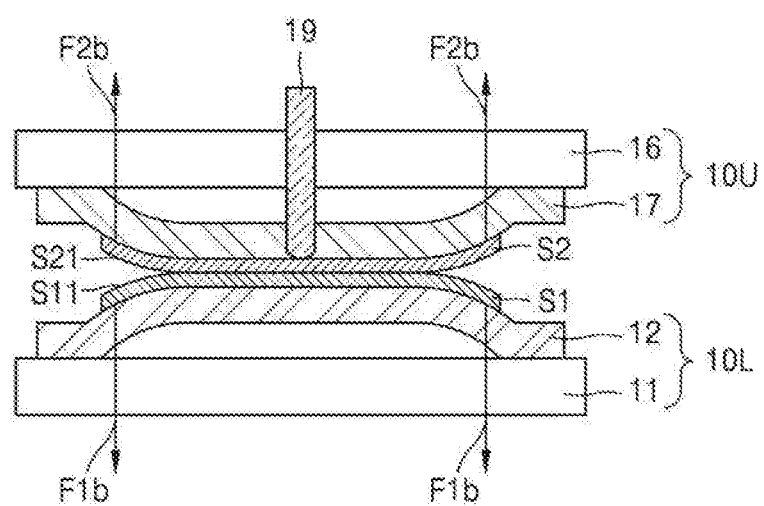

Next, referring to FIGS. 1 and 2E, in operation S150, after bonding the first substrate S1 to the second substrate S2 at the bonding initiation point, a bonding area between the first substrate S1 and the second substrate S2 is propagated from the bonding initiation point toward a peripheral area of the first and second substrates S1 and S2. That is, the bonding area between the first substrate S1 and the second substrate S2 is to be increased. To propagate the bonding area (or to increase the bonding area), a separation distance between the first bonding chuck 10L and the second bonding chuck 10U around the contact point or the bonding initiation point may be reduced. Upon reducing the separation distance between the first bonding chuck 10L and the second bonding chuck 10U, the respective central areas of the first bonding chuck 10L and the second bonding chuck 10U may extend flat, and accordingly, the respective central areas of the first substrate S1 and the second substrate S2 may be deformed flat (i.e., returned to their respective flat form). The respective central areas of the first substrate S1 and the second substrate S2 may be bonded to each other.

While bonding the central area of the first substrate S1 and the central area of the second substrate S2 to each other, the peripheral area of the first substrate S1 is vacuum-adsorbed to the first deformable plate 12, and thus, the peripheral area of the first substrate S1 may maintain a curved state with a certain curvature. In addition, the peripheral area of the second substrate S2 is vacuum-adsorbed to the second deformable plate 17, and thus, the peripheral area of the second substrate S2 may maintain a curved state with a certain curvature.

While bonding the central area of the first substrate S1 and the central area of the second substrate S2 to each other, the pneumatic pressure applied to the first deformable plate 12 and the pneumatic pressure applied to the second deformable plate 17 may be reduced so as to more easily bond the first deformable plate 12 and the second deformable plate 17 by the first deformable plate 12 and the second deformable plate 17 returning to their flat form. In this case, the pneumatic pressure applied to the first deformable plate 12 and the pneumatic pressure applied to the second deformable plate 17 may be equally changed so as to uniformly bond the first deformable plate 12 and the second deformable plate 17.

According to an example embodiment, while the bonding area between the first substrate S1 and the second substrate S2 is being propagated in a transverse direction (or a radial direction of the first substrate S1 and the second substrate S2) from the bonding initiation point, a bonding propagation distance that is a propagated distance of the bonding area from the bonding initiation point may be measured by a sensor mounted on at least one of the first bonding chuck 10L and the second bonding chuck 10U. When the bonding propagation distance measured by the sensor reaches a pre-defined distance, it may be determined that the bonding between the central area of the first substrate S1 and the central area of the second substrate S2 is completed. For example, when the bonding propagation distance measured by the sensor reaches a radius of the central area of the first substrate S1 or a radius of the central area of the second substrate S2, it may be determined that the bonding between the central area of the first substrate S1 and the central area of the second substrate S2 is completed.

Figure 2F:
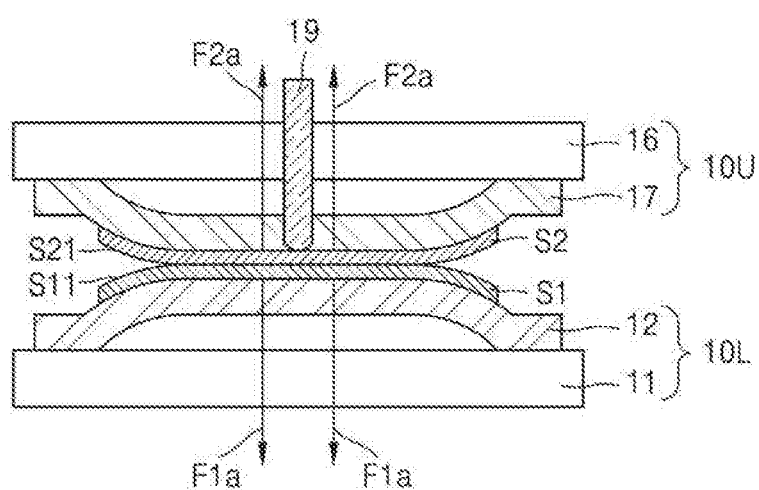

Next, referring to FIGS. 1 and 2F, in operation S160, upon completing the bonding between the central area of the first substrate S1 and the central area of the second substrate S2, the respective central areas of the first substrate S1 and the second substrate S2 are vacuum-adsorbed again, and the vacuum adsorption for the respective peripheral areas of the first substrate S1 and the second substrate S2 is discontinued.

Figure 2G:
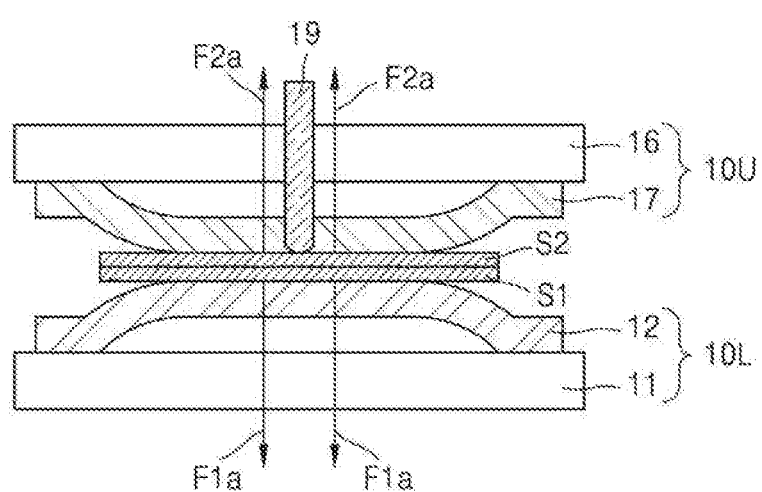

As shown in FIG. 2G, upon releasing the vacuum adsorption for the respective peripheral areas of the first substrate S1 and the second substrate S2, the peripheral area of the first substrate S1 may be separated from the first bonding chuck 10L and the peripheral area of the second substrate S2 may be separated from the second bonding chuck 10U. In addition, the first bonding chuck 10L may vacuum-adsorb the central area of the first substrate S1 and the second bonding chuck 10U may vacuum-adsorb the central area of the second substrate S2, so as to support the first substrate S1 and the second substrate S2 on the first bonding chuck 10L and the second bonding chuck 10U, respectively, while bonding the peripheral area of the first substrate S1 and the peripheral area of the second substrate S2 to each other. When the bonding between the peripheral area of the first substrate S1 and the peripheral area of the second substrate S2 is completed, a bonding substrate including the first substrate S1 and the second substrate S2 bonded to each other may be formed.

When the bonding between the first substrate S1 and the second substrate S2 is completed, the bonding substrate is unloaded from the first bonding chuck 10L and the second bonding chuck 10U in operation S170. To separate the bonding substrate from the first bonding chuck 10L and the second bonding chuck 10U, the vacuum adsorption for the respective central areas of the first substrate S1 and the second substrate S2 may be terminated.

According to an example embodiment, because the first substrate S1 and the second substrate S2 may be bonded while symmetrically deformed the first substrate S1 and the second substrate S2 are straightened, a distortion defect of the first substrate S1 and the second substrate S2 may be reduced, and accordingly, the reliability of a bonding process may be improved.

Figure 3A:
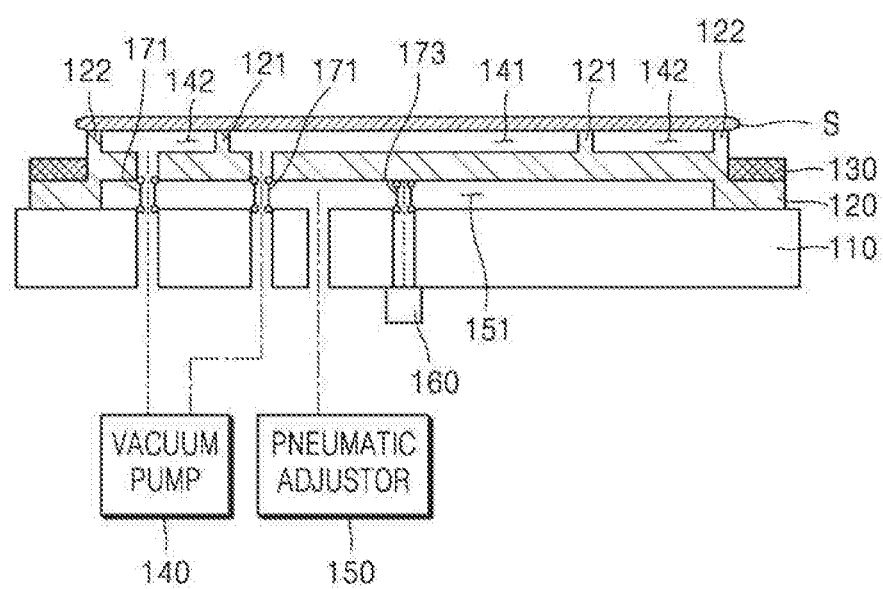
FIGS. 3A and 3B are cross-sectional views schematically illustrating a bonding chuck according to example embodiments.
Figure 3B:
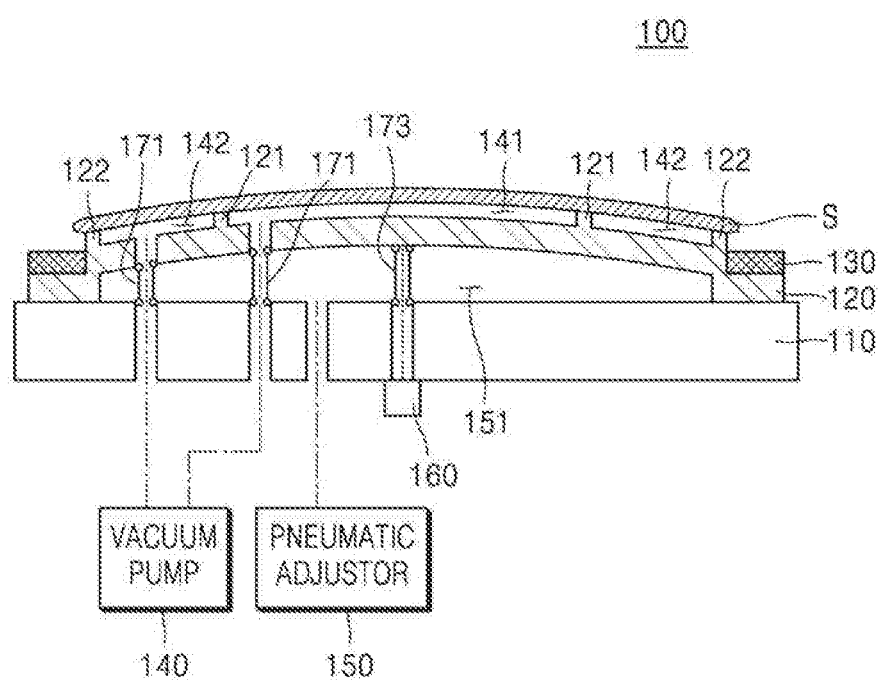
Figure 4:
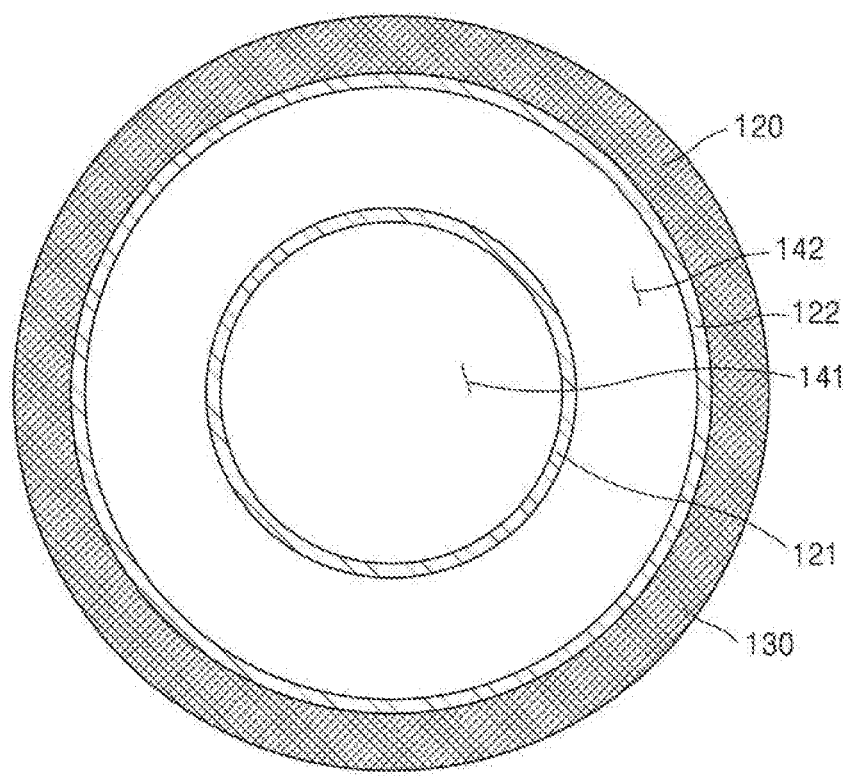
FIG. 4 is a top view of a deformable plate of the bonding chuck.

FIGS. 3A and 3B are cross-sectional views schematically showing a bonding chuck 100 according to example embodiments. FIG. 4 is a top view showing a deformable plate 120 of the bonding chuck 100. FIG. 3A shows a state before the deformable plate 120 of the bonding chuck 100 is deformed, and FIG. 3B shows a deformed state of the deformable plate 120 of the bonding chuck 100.

Referring to FIGS. 3A and 3B, the bonding chuck 100 may include a base 110, the deformable plate 120, a vacuum pump 140, a pneumatic adjustor 150, and a sensor 160.

The deformable plate 120 may be provided on the base 110. The deformable plate 120 may support a substrate S loaded thereon. The deformable plate 120 may be deformed in a state of supporting the substrate S, thereby deforming a shape of the substrate S. The deformable plate 120 may have a shape corresponding to the substrate S, e.g., a circular plate shape.

The deformable plate 120 may be mounted on the base 110 such that a distance between the deformable plate 120 and the base 110 is variable. For example, an edge of the deformable plate 120 may be fixed to the base 110 by a ring-shaped clamp 130, but a shape of a center part of the deformable plate 120 may be deformed by an external force. For example, the deformable plate 120 may be deformed convexly in a direction away from the base 110. According to the deformation of the deformable plate 120, the distance between the deformable plate 120 and the base 110 may be varied.

According to an example embodiment, the deformable plate 120 may include a metal, ceramic, rubber, or a combination thereof. For example, the deformable plate 120 may include aluminum (Al), or silicon carbide (SiC).

The deformable plate 120 may include a partition configured to partition or separate an inner space 141 corresponding to a central area of the substrate S from an outer space 142 corresponding to a peripheral area of the substrate S. For example, the deformable plate 120 may include an inner partition 121 and an outer partition 122, which come in contact with a lower surface of the substrate S. Each of the inner partition 121 and an outer partition 122 may have a ring shape. The inner partition 121 and an outer partition 122 may be arranged in a concentric form around a central axis of the deformable plate 120. In this case, the inner space 141 may be defined as a space provided within the inner partition 121 in a radial direction, and the outer space 142 may be defined as a space between the inner partition 121 and the outer partition 122 in the radial direction. Accordingly, vacuum pressure for vacuum-adsorbing the central area of the substrate S may be generated in the inner space 141, and vacuum pressure for vacuum-adsorbing the peripheral area of the substrate S may be generated in the outer space 142.

Although it is illustrated that the deformable plate 120 includes two partitions, the number of partitions included in the deformable plate 120 is not limited thereto. For example, the deformable plate 120 may include three or more partitions arranged in a concentric form.

The vacuum pump 140 may provide an adsorption force for vacuum-adsorbing the substrate S. The vacuum pump 140 may adjust pressure in the inner space 141 and pressure in the outer space 142. For example, the vacuum pump 140 may adjust the pressure in the inner space 141 between the vacuum pressure and the atmospheric pressure and adjust the pressure in the outer space 142 between the vacuum pressure and the atmospheric pressure.

For example, the vacuum pump 140 may pump air into the inner space 141 enclosed by the inner partition 121, through an inner vacuum passage formed in the base 110, a first sealing material 171 having a passage communicating with the inner vacuum passage in the base 110, and an inner vacuum hole of the deformable plate 120. In addition, the vacuum pump 140 may pump air into the outer space 142 formed between the inner partition 121 and the outer partition 122, through an outer vacuum passage formed in the base 110, the first sealing material 171 having a passage communicating with the outer vacuum passage in the base 110, and an outer vacuum hole of the deformable plate 120.

For example, the vacuum pump 140 may adjust the pressure in the inner space 141 through the inner vacuum hole of the deformable plate 120, which communicates with the inner space 141 surrounded by the inner partition 121. When the vacuum pressure is formed in the inner space 141 according to an operation of the vacuum pump 140, the central area of the substrate S may be adsorbed to the deformable plate 120. In addition, the vacuum pump 140 may adjust the pressure in the outer space 142 through the outer vacuum hole of the deformable plate 120, which communicates with the outer space 142 between the inner partition 121 and the outer partition 122. When the vacuum pressure is formed in the outer space 142 according to an operation of the vacuum pump 140, the peripheral area of the substrate S may be adsorbed to the deformable plate 120.

The vacuum pump 140 may independently adjust an adsorption force applied to the central area of the substrate S and an adsorption force applied to the peripheral area of the substrate S. For example, the vacuum pump 140 may adjust the pressure in the inner space 141 and the pressure in the outer space 142 such that the pressures therein are the same or different from each other.

The pneumatic adjustor 150 may deform the deformable plate 120 by adjusting pneumatic pressure in a cavity 151 formed between the base 110 and the deformable plate 120. For example, the base 110 may have an air flow hole connected to the pneumatic adjustor 150 and communicating with the cavity 151, and the pneumatic adjustor 150 may inject or exhaust a fluid (e.g., air) into or from the cavity 151 through the air flow hole formed in the base 110. For example, the pneumatic adjustor 150 may be configured to inject air into the cavity 151 such that pressure in the cavity 151 increases or to exhaust air in the cavity 151 such that the pressure in the cavity 151 decreases.

As shown in FIG. 3B, the pneumatic adjustor 150 may increase the pressure in the cavity 151 by injecting air into the cavity 151. According to the increase in the pressure in the cavity 151, the deformable plate 120 may be convexly deformed, and in correspondence to the deformation of the deformable plate 120, the substrate S supported by the deformable plate 120 may also be deformed. The pneumatic adjustor 150 may adjust the pressure in the cavity 151 to adjust a maximum distance between the deformable plate 120 and the base 110 and a curvature of the substrate S.

The sensor 160 may be configured to sense a deformed degree of the deformable plate 120. For example, the sensor 160 may be mounted on the base 110 and configured to measure a deformed height of the deformable plate 120 through a sensing passage formed in the base 110. For example, the sensor 160 may be configured to measure a displacement of the center of the deformable plate 120 from the base 110.

According to an example embodiment, the sensor 160 may be a contactless sensor to which any one of a laser scheme, an ultrasonic scheme, and an infrared scheme is applied. Alternatively, the sensor 160 may be a contact sensor.

The first sealing material 171 and a second sealing material 173 for sealing the cavity 151 from the external elements may be mounted between the deformable plate 120 and the base 110. For example, an upper end of the first sealing material 171 may be fixed to the deformable plate 120, and a lower end of the first sealing material 171 may be fixed to the base 110. The first sealing material 171 may have, for example, a cylindrical shape and include a passage communicating with vacuum holes formed in the deformable plate 120 and with vacuum passages in the base 110 connected to the vacuum pump 140. In addition, the second sealing material 173 may have, for example, a cylindrical shape, an upper end of the second sealing material 173 may be fixed to the deformable plate 120, and a lower end of the second sealing material 173 may be fixed to the base 110. The second sealing material 173 may include a passage communicating with a sensing passage formed in the base 110.

A vertical-direction length of each of the first sealing material 171 and the second sealing material 173 may be varied. That is, while the deformable plate 120 is being deformed, the first sealing material 171 and the second sealing material 173 may be elongated or shortened in the vertical direction according to the deformation level of the deformable plate 120.

When the vacuum pressure for adsorbing the substrate S is generated by the vacuum pump 140, the outer space 142 and/or the inner space 141 may be separated from the cavity 151 by the first sealing material 171, and thus, the vacuum pressure in the outer space 142 and/or the inner space 141 may be maintained. In addition, because the air in the cavity 151 may be prevented from being leaked to the outside by the first sealing material 171 and the second sealing material 173, the pressure in the cavity 151, which has been adjusted by the pneumatic adjustor 150, may be maintained.

Although not particularly shown in FIGS. 3A and 3B, the bonding chuck 100 may further include a lift pin configured to support the substrate S by protruding from the deformable plate 120 in loading and unloading processes of the substrate S.

Figure 5:
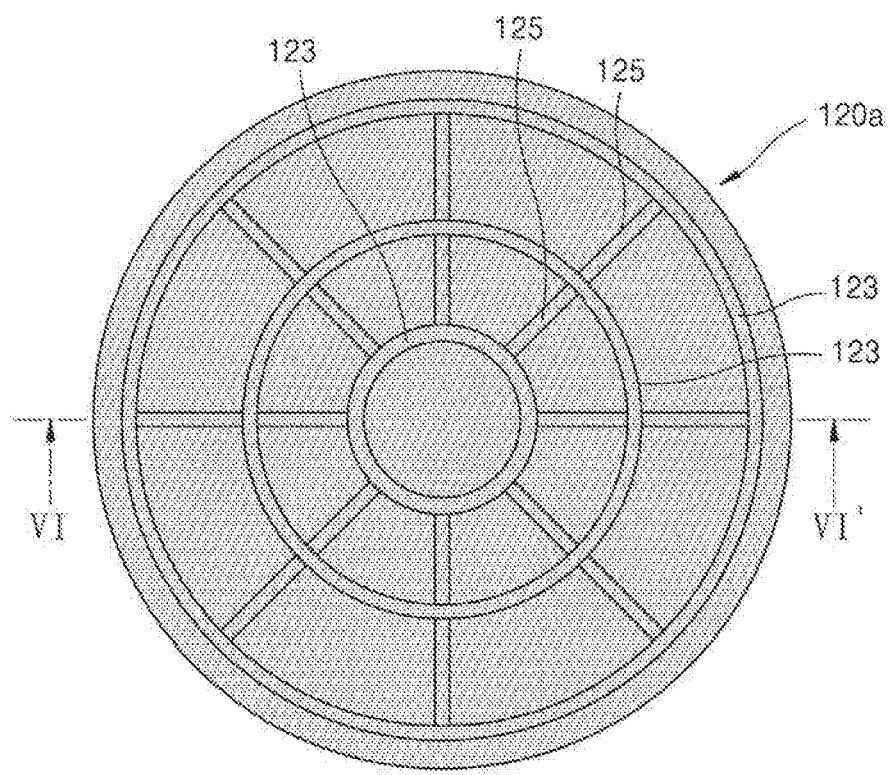
FIG. 5 is a bottom view of a deformable plate according to an example embodiment.
Figure 6:
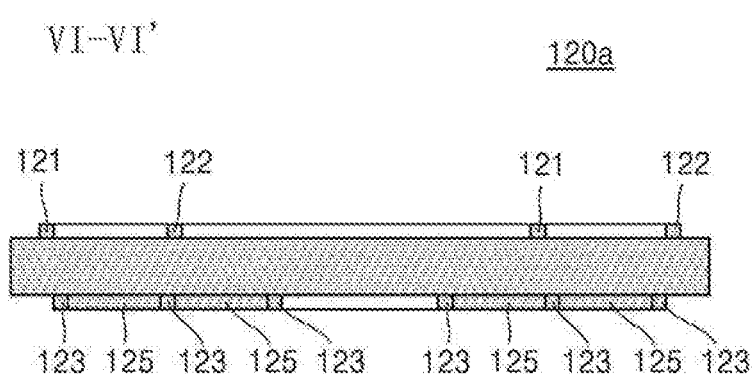
FIG. 6 is a cross-sectional view of the deformable plate along line VI-VI' of FIG. 5 according to an example embodiment.

FIG. 5 is a bottom view of a deformable plate 120a according to an example embodiment. FIG. 6 is a cross-sectional view of the deformable plate 120a along line VI-VI' of FIG. 5.

Referring to FIGS. 5 and 6, the deformable plate 120a may include a plurality of first ribs 125 radially arranged. For example, eight first ribs 125 may extend in a radial direction and be spaced apart from each other at an equal angle. The plurality of first ribs 125 have a symmetrical shape around a central axis of the deformable plate 120a, and thus, the plurality of first ribs 125 may help deformation of the deformable plate 120a such that the deformable plate 120a is generally, uniformly deformed.

In addition, the deformable plate 120a may include a plurality of second ribs 123 arranged in a concentric form around the central axis of the deformable plate 120a. The plurality of second ribs 123 have a circular shape around the central axis of the deformable plate 120a, and thus, the plurality of second ribs 123 may help deformation of the deformable plate 120a such that the deformable plate 120a is generally, uniformly deformed.

Figure 7A:
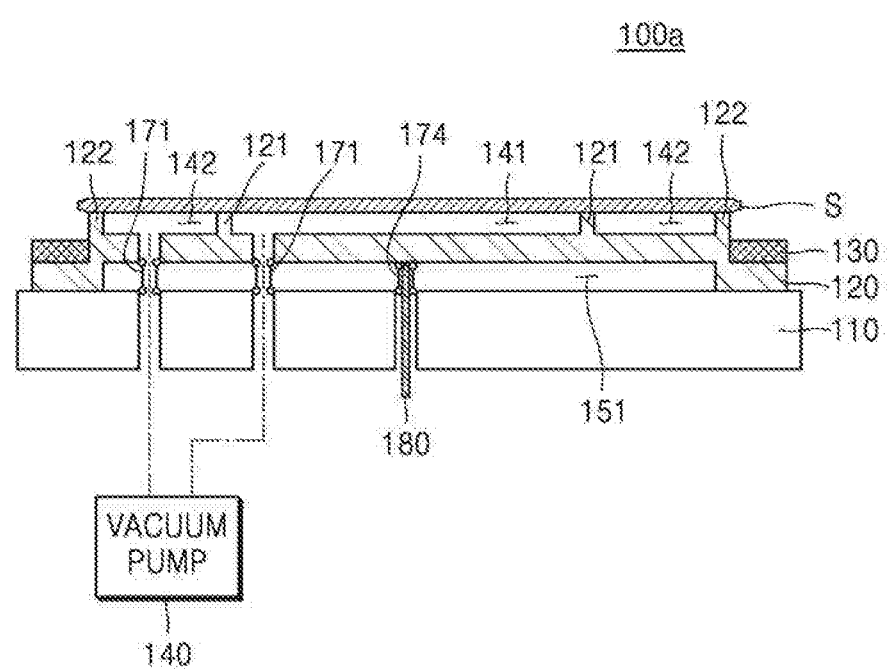
FIGS. 7A and 7B are cross-sectional views schematically illustrating a bonding chuck according to example embodiments.
Figure 7B:
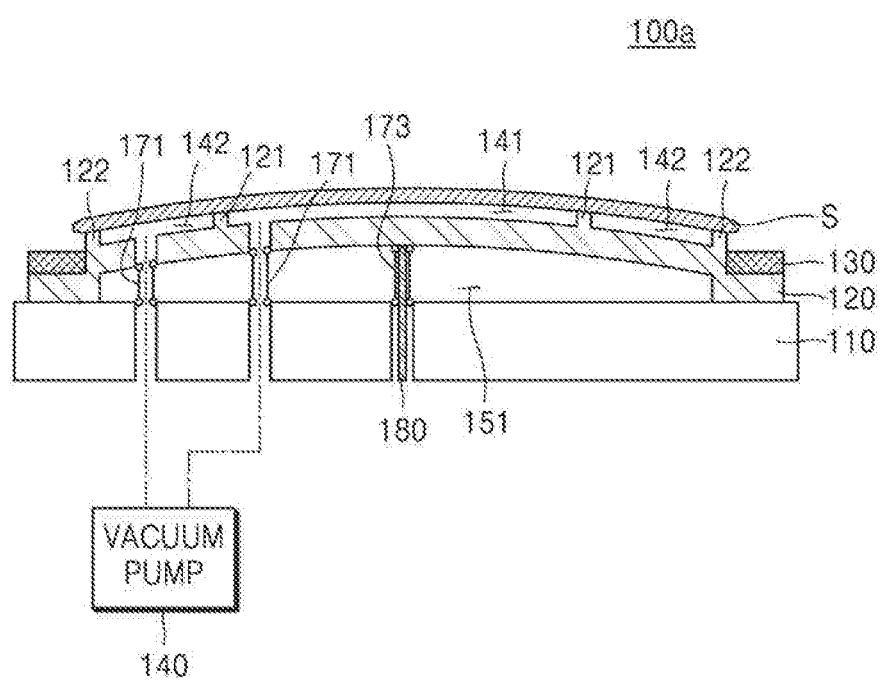

FIGS. 7A and 7B are cross-sectional views schematically showing a bonding chuck 100a according to an example embodiment. FIG. 7A shows a state before the deformable plate 120 of the bonding chuck 100a is deformed, and FIG. 7B shows a deformed state of the deformable plate 120 of the bonding chuck 100a. The bonding chuck 100a shown in FIGS. 7A and 7B may be generally the same as or similar to the bonding chuck 100 shown in FIGS. 3A and 3B except that the bonding chuck 100a includes a push rod 180.

Referring to FIGS. 7A and 7B, the bonding chuck 100a may include the push rod 180 configured to deform the deformable plate 120 by physically pressing the deformable plate 120. For example, the push rod 180 may be inserted into a hole penetrating through the base 110 and may move in the vertical direction by being power-connected to an actuator such as a motor. The push rod 180 may physically press the deformable plate 120 while moving upward. The push rod 180 may change a shape of the deformable plate 120 and change a shape of the substrate S supported by the deformable plate 120.

The push rod 180 is configured to deform the deformable plate 120 by directly pressing the deformable plate 120, and thus, a displacement of the deformed deformable plate 120 may be obtained from a displacement of the push rod 180. In this case, because the displacement of the deformable plate 120 may be obtained from the displacement of the push rod 180, a sensor configured to measure the displacement of the deformable plate 120 may be omitted.

According to an example embodiment, the push rod 180 may be configured to deform the deformable plate 120 in cooperation with the pneumatic adjuster 150 of FIGS. 3A and 3B.

A third sealing material 174 having a passage communicating with the hole in the base 110 into which the push rod 180 is inserted may be provided between the deformable plate 120 and the base 110. The third sealing material 174 may separate the hole in the base 110, into which the push rod 180 is inserted, from the cavity 151 such that the cavity 151 is sealed. An upper end of the third sealing material 174 may be fixed to the deformable plate 120, and a lower end of the third sealing material 174 may be fixed to the base 110. The third sealing material 174 may be configured to be elongated or contracted in the vertical direction, similarly to the first and second sealing materials 171 and 173.

Figure 8:
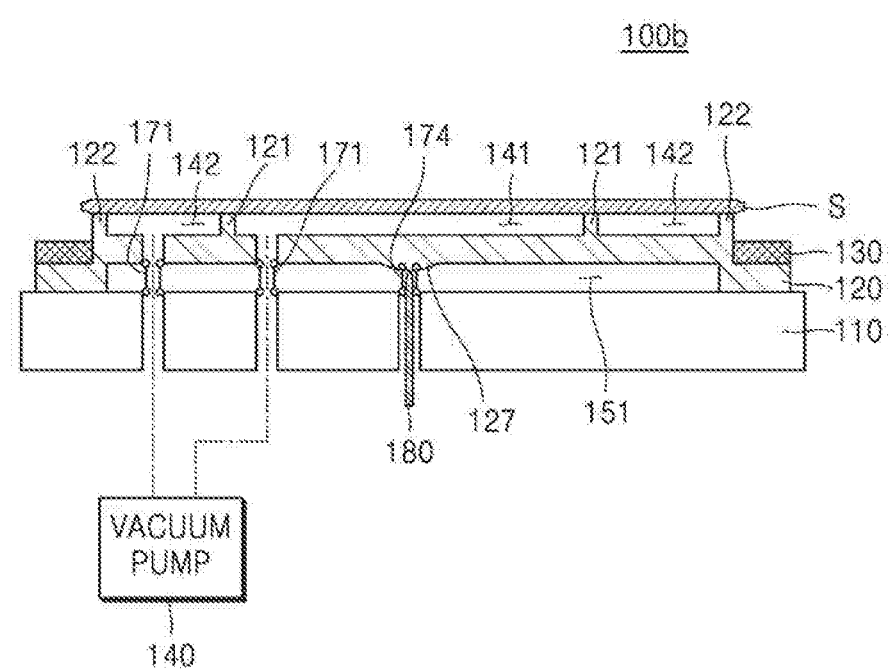
FIG. 8 is a cross-sectional view schematically illustrating a bonding chuck according to an example embodiment.

FIG. 8 is a cross-sectional view schematically showing a bonding chuck 100b according to an example embodiment. The bonding chuck 100b shown in FIG. 8 may be generally the same as or similar to the bonding chuck 100a shown in FIGS. 7A and 7B except that the deformable plate 120 includes a convex surface part 127 at a portion of the deformable plate 120 with which the push rod 180 comes in contact.

Referring to FIG. 8, the deformable plate 120 may include the convex surface part 127 at the portion of the deformable plate 120 with which the push rod 180 comes in contact. A thickness of the deformable plate 120 at the part at which the convex surface part 127 is formed may be greater than a thickness of the deformable plate 120 around the convex surface part 127. When the push rod 180 presses the deformable plate 120 to deform the deformable plate 120, the convex surface part 127 may disperse a force applied to the deformable plate 120 by the push rod 180. Accordingly, when the deformable plate 120 is pressed by the push rod 180, the deformable plate 120 may be more uniformly deformed.

Figure 9:
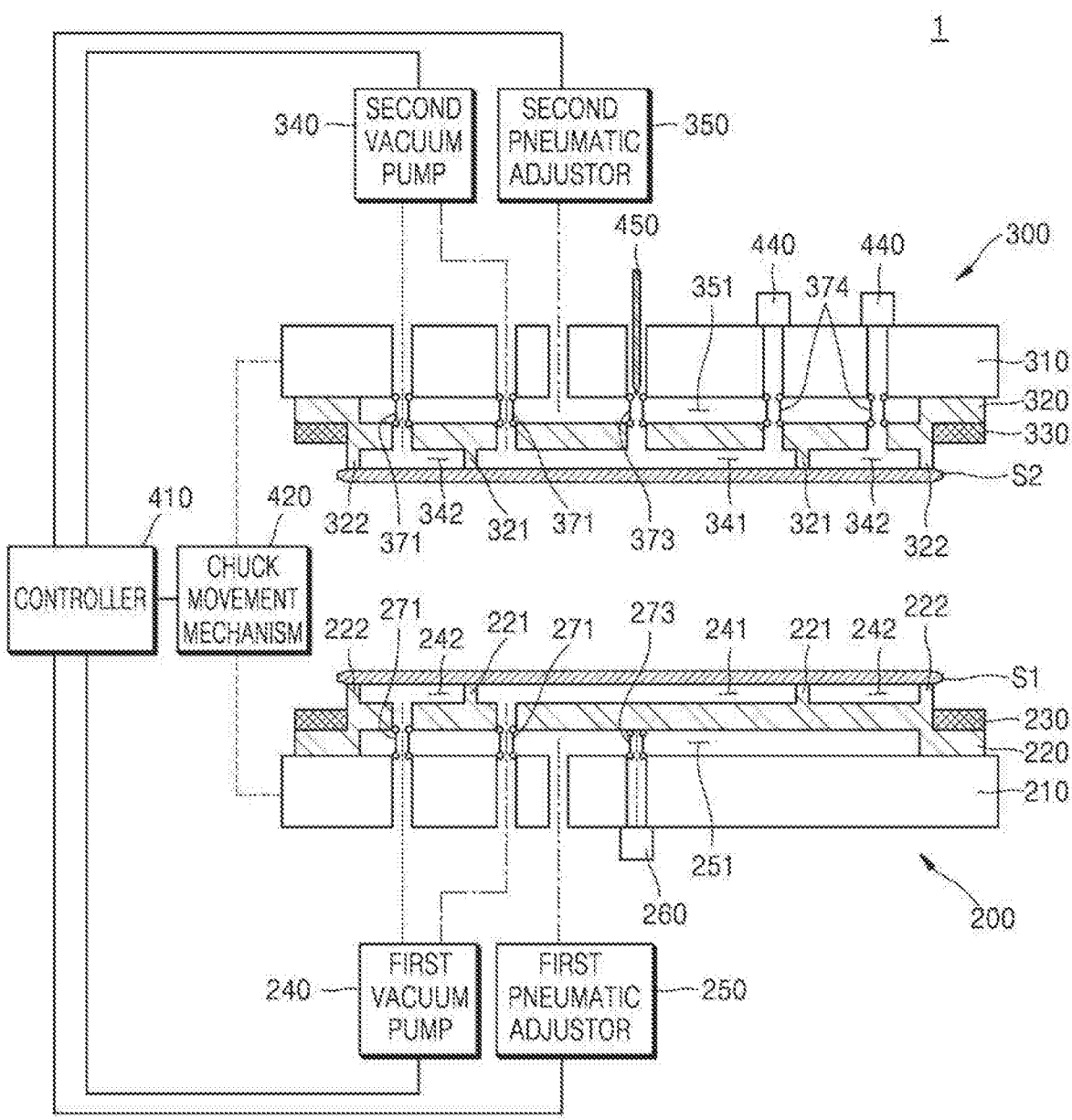
FIG. 9 is a cross-sectional view schematically showing a substrate bonding apparatus according to an example embodiment.

FIG. 9 is a cross-sectional view schematically showing a substrate bonding apparatus 1 according to an example embodiment.

Referring to FIG. 9, the substrate bonding apparatus 1 may include a first bonding chuck 200, a second bonding chuck 300, a controller 410, a chuck movement mechanism 420, a bonding propagation detector 440, and a bonding initiation member 450.

The first bonding chuck 200 may support the first substrate S1 to be bonded. The first bonding chuck 200 may include a first base 210, a first deformable plate 220, a first clamp 230 for fixing the first deformable plate 220 to the first base 210, a first vacuum pump 240, a first pneumatic adjustor 250, a sensor 260, and sealing materials 271 and 273. The first vacuum pump 240 may independently adjust pressure in an inner space 241 surrounded by an inner partition 221 and pressure in an outer space 242 between an outer partition 222 and the inner partition 221. The first pneumatic adjustor 250 may deform the first deformable plate 220 by adjusting pressure in a first cavity 251 formed between the first base 210 and the first deformable plate 220. For example, the first bonding chuck 200 may include the bonding chuck 100 described with reference to FIGS. 3A and 3B.

The second bonding chuck 300 may support the second substrate S2 to be bonded with the first substrate S1. The second bonding chuck 300 may support the second substrate S2 such that a first bonding surface of the first substrate S1 faces a second bonding surface of the second substrate S2. The second bonding chuck 300 may include a second base 310, a second deformable plate 320, a second clamp 330 for fixing the second deformable plate 320, a second vacuum pump 340, a second pneumatic adjustor 350, and sealing materials 371, 373, and 374. The second vacuum pump 340 may independently adjust pressure in an inner space 341 surrounded by an inner partition 321 and pressure in an outer space 342 between an outer partition 322 and the inner partition 321. The second pneumatic adjustor 350 may deform the second deformable plate 320 by adjusting pressure in a second cavity 351 formed between the second base 310 and the second deformable plate 320. For example, the second bonding chuck 300 may also include the bonding chuck 100 described with reference to FIGS. 3A and 3B.

The bonding initiation member 450 may penetrate through the second bonding chuck 300. The bonding initiation member 450 may function to generate a bonding initiation point between the first substrate S1 and the second substrate S2. That is, similarly to the description made with reference to FIG. 2D, the bonding initiation member 450 may press against the second substrate S2 such that bonding between the first substrate S1 and the second substrate S2 is initiated. In an example embodiment, the bonding initiation member 450 may press the second deformable plate 320 supporting the second substrate S2 such that bonding between the first substrate S1 and the second substrate S2 is initiated.

The bonding initiation member 450 may include a sensor configured to measure a displacement of the bonding initiation member 450. A displacement of the second deformable plate 320 may be obtained based on the displacement of the bonding initiation member 450, which is measured by the sensor included in the bonding initiation member 450. In addition, the bonding initiation member 450 may include a sensor configured to measure a force applied to the second deformable plate 320 by the bonding initiation member 450.

The sealing material 373 formed in a cylindrical shape and having a passage communicating with a hole in the second base 310 into which the bonding initiation member 450 is inserted may be arranged between the second deformable plate 320 and the second base 310. The sealing material 373 may separate the second cavity 351 from the hole in the second base 310 into which the bonding initiation member 450 is inserted, such that the second cavity 351 is sealed. An upper end of the sealing material 373 may be fixed to the second base 310, and a lower end of the sealing material 373 may be fixed to the second deformable plate 320. The sealing material 373 may be elongated or shortened in the vertical direction while the second deformable plate 320 is being deformed.

The chuck movement mechanism 420 may be configured to move the first bonding chuck 200 and the second bonding chuck 300. The chuck movement mechanism 420 may raise and lower the first bonding chuck 200 and raise and lower the second bonding chuck 300. While a bonding process is progressing, the chuck movement mechanism 420 may appropriately adjust a distance between the first bonding chuck 200 and the second bonding chuck 300. For example, the chuck movement mechanism 420 may include an actuator such as a driving motor.

The bonding propagation detector 440 may detect propagation of a bonding area formed when the first substrate S1 comes in contact with the second substrate S2. A bonding propagation distance may be obtained based on information sensed by the bonding propagation detector 440. For example, the bonding propagation detector 440 may include a plurality of sensors mounted on the second base 310 of the second bonding chuck 300. The plurality of sensors may be arranged along a radial direction of the second base 310. Each of the plurality of sensors may be configured to measure a vertical-direction displacement of the second deformable plate 320.

Because a portion of the second substrate S2 bonded to the first substrate S1 and a portion of the second deformable plate 320 supporting the portion of the second substrate S2 have a flat shape, a displacement of the second deformable plate 320 at a bonding-completed part may be constant in the radial direction. Therefore, a distance of the bonding area propagated from the bonding initiation point may be obtained based on the displacement of the second deformable plate 320, which has been measured by the plurality of sensors included in the bonding propagation detector 440.

According to an example embodiment, when the bonding propagation distance measured by the bonding propagation detector 440 reaches the radius of the central area of the second substrate S2, it may be determined that the bonding between the central area of the first substrate S1 and the central area of the second substrate S2 is completed. In addition, when the bonding propagation distance measured by the bonding propagation detector 440 reaches a radius of the second substrate S2, it may be determined that bonding between the peripheral area of the first substrate S1 and the peripheral area of the second substrate S2 is completed.

Although FIG. 9 shows that the bonding propagation detector 440 is mounted on the second bonding chuck 300, the placement of the bonding propagation detector 440 is not limited thereto. For example, the bonding propagation detector 440 may be mounted on the first bonding chuck 200 instead. In this case, the plurality of sensors included in the bonding propagation detector 440 may be arranged in the radial direction on the first base 210, and each of the plurality of sensors may be configured to measure a vertical-direction displacement of the first deformable plate 220.

The sealing material 374 formed in a cylindrical shape and having a passage communicating with a sensing passage formed in the second base 310 may be arranged between the second deformable plate 320 and the second base 310. The sealing material 374 may separate the second cavity 351 from the sensing passage in the second base 310, such that the second cavity 3M is sealed. An upper end of the sealing material 374 may be fixed to the second base 310, and a lower end of the sealing material 374 may be fixed to the second deformable plate 320. The sealing material 374 may be elongated or contracted in the vertical direction while the second deformable plate 320 is being deformed.

The controller 410 may control driving of the first bonding chuck 200, the second bonding chuck 300, and the chuck movement mechanism 420. For example, the controller 410 may receive information about displacements of the first deformable plate 220 and the second deformable plate 320 from the sensor 260 included in the first bonding chuck 200, the sensor included in the bonding initiation member 450, and the sensors included in the bonding propagation detector 440 and control driving of the first and second bonding chucks 200 and 300 based on the information about the displacements such that the first and second deformable plates 220 and 320 are symmetrically deformed. For example, the controller 410 may include a general personal computer (PC), a workstation, a supercomputer, or the like.

According to an example embodiment, the controller 410 may control driving of the first pneumatic adjustor 250 and the second pneumatic adjustor 350 such that the first and second deformable plates 220 and 320 are symmetrically deformed and flattened. For example, the controller 410 may control driving of the first pneumatic adjustor 250 and the second pneumatic adjustor 350 such that pressure in the first cavity 251 is the same as pressure in the second cavity 351.

For example, the controller 410 may generate a driving signal based on the displacement of the first deformable plate 220, which is measured by the sensor 260 of the first bonding chuck 200, and the displacement of the second deformable plate 320, which is measured by the sensor of the bonding initiation member 450, and apply the driving signal to each of the first pneumatic adjustor 250 and the second pneumatic adjustor 350. In response to the driving signal, the first and second pneumatic adjustors 250 and 350 may deform the first and second deformable plates 220 and 320, respectively, such that the displacement of the first deformable plate 220 is equal to the displacement of the second deformable plate 320.

According to an example embodiment, the controller 410 may control driving of the first vacuum pump 240 and the second vacuum pump 340 based on information about the bonding propagation distance from the bonding propagation detector 440. For example, as described with reference to FIG. 2E, while bonding between the central area of the first substrate S1 and the central area of the second substrate S2 is being propagated, the controller 410 may apply a driving signal to each of the first and second pumps 240 and 340 to vacuum-adsorb the peripheral area of each of the first and second substrates S1 and S2 and to stop vacuum adsorption for the central area of each of the first and second substrates S1 and S2. In addition, as described with reference to FIG. 2F, when the bonding between the central area of the first substrate S1 and the central area of the second substrate S2 is completed, the controller 410 may apply a driving signal to each of the first and second pumps 240 and 340 to vacuum-adsorb the central area of each of the first and second substrates S1 and S2 and to stop the vacuum adsorption for the peripheral area of each of the first and second substrates S1 and S2.

Figure 10:
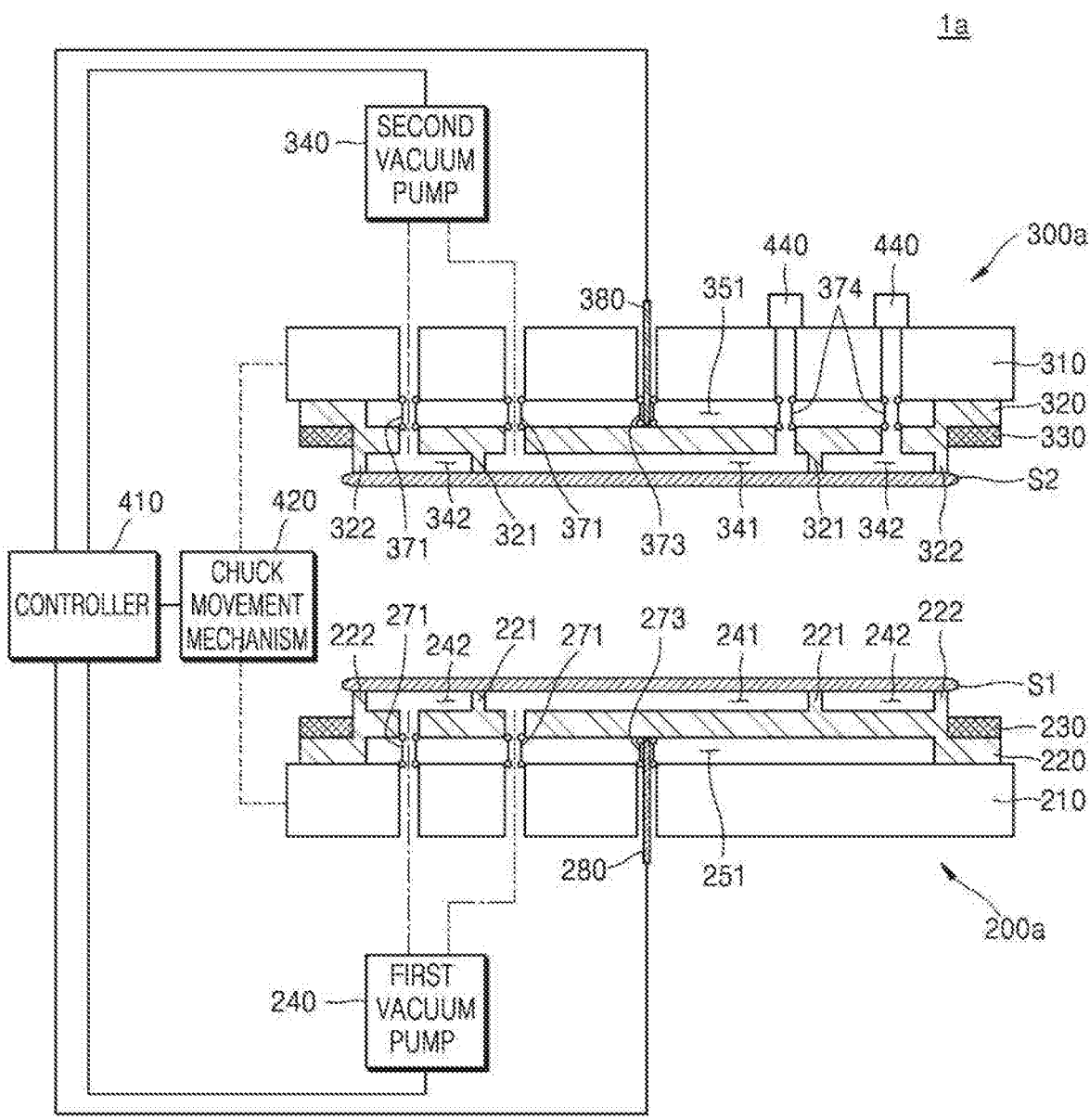
FIG. 10 is a cross-sectional view schematically showing a substrate bonding apparatus according to an example embodiment.

FIG. 10 is a cross-sectional view schematically showing a substrate bonding apparatus 1a according to an example embodiment. The substrate bonding apparatus 1a shown in FIG. 10 may be similar to the substrate bonding apparatus 1 shown in FIG. 9 except that first and second bonding chucks 200a and 300a include first and second push rods 280 and 380, respectively.

Referring to FIG. 10, the first bonding chuck 200a may include the first base 210, the first deformable plate 220, the first clamp 230 for fixing the first deformable plate 220, the first vacuum pump 240, the first push rod 280, the sensor 260, and the sealing materials 271 and 273. For example, the first bonding chuck 200a may include the bonding chuck 100a described with reference to FIGS. 7A and 7B.

The second bonding chuck 300a may include the second base 310, the second deformable plate 320, the second clamp 330 for fixing the second deformable plate 320, the second vacuum pump 340, the second push rod 380, and the sealing materials 371, 373, and 374. For example, the second bonding chuck 300a may include the bonding chuck 100a described with reference to FIGS. 7A and 7B.

According to an example embodiment, the controller 410 may control driving of the first push rod 280 and the second push rod 380 such that the first deformable plate 220 and the second deformable plate 320 are deformed symmetrically to each other. For example, the controller 410 may control driving of the first push rod 280 and the second push rod 380 such that pressure in the first cavity 251 is the same as pressure in the second cavity 351 by changing the cavity area of the first cavity 251 and the second cavity 351.

According to an example embodiment, the controller 410 may generate a driving signal based on a displacement of the first push rod 280, which corresponds to the displacement of the first deformable plate 220, and a displacement of the second push rod 380, which corresponds to the displacement of the second deformable plate 320, and apply the generated driving signal to the first and second push rods 280 and 380. In response to the driving signal, the first and second push rods 280 and 380 may deform the first and second deformable plates 220 and 320, respectively, such that the displacement of the first deformable plate 220 is equal to the displacement of the second deformable plate 320.

Figure 11:
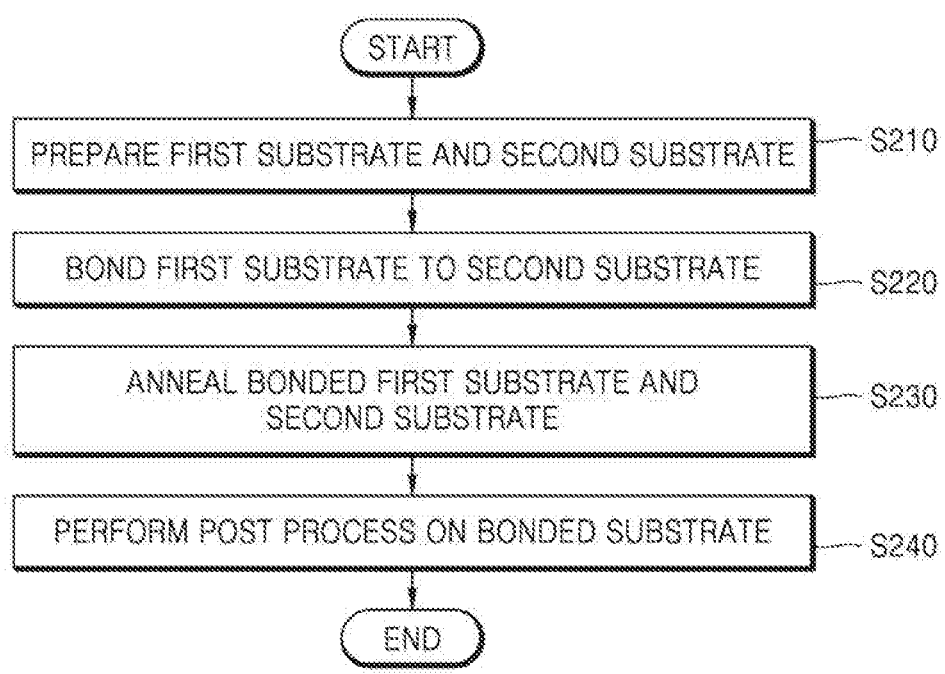
FIG. 11 is a flowchart illustrating a method of manufacturing a semiconductor device, according to an example embodiment.
Figure 12A:
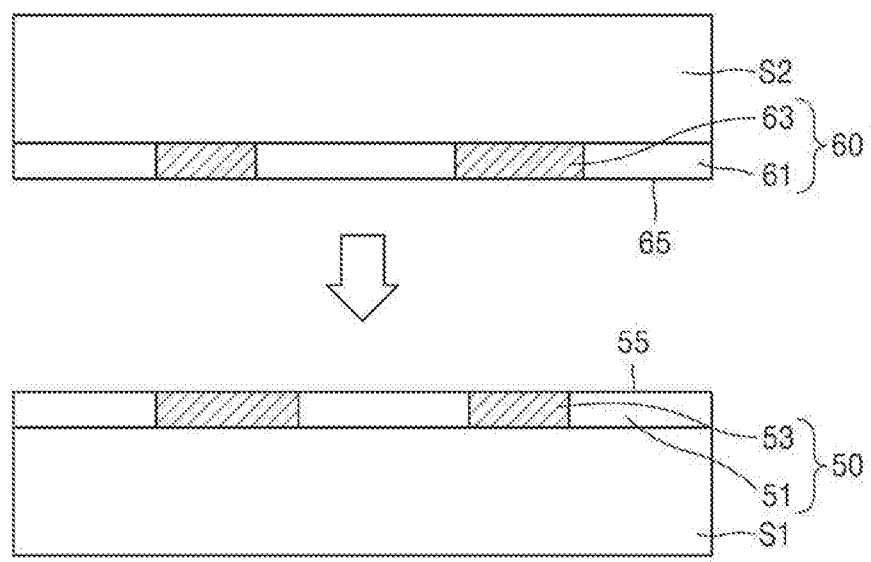
FIGS. 12A and 12B are cross-sectional views sequentially illustrating a process of bonding a first substrate to a second substrate.
Figure 12B:
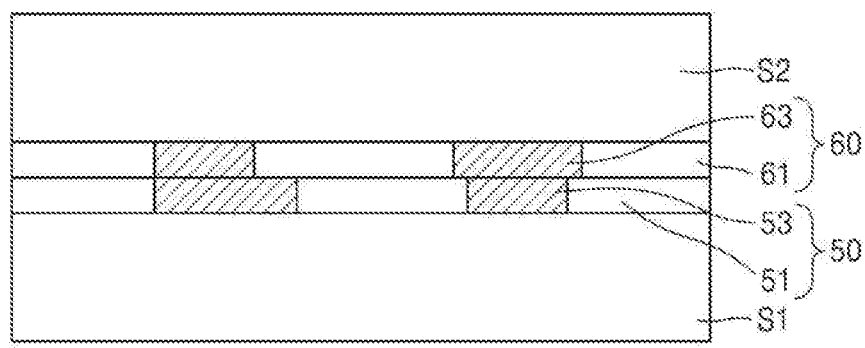

FIG. 11 is a flowchart illustrating a method of manufacturing a semiconductor device according to an example embodiment. FIGS. 12A and 12B are cross-sectional views sequentially showing a process of bonding the first substrate S1 to the second substrate S2. Hereinafter, a method of manufacturing a semiconductor device, according to an example embodiment, will be described with reference to FIGS. 11, 12A, and 12B together with FIG. 9.

Referring to FIGS. 11 and 12A, in operation S210, the first substrate S1 and the second substrate S2 to be bonded are prepared.

Each of the first and second substrates S1 and S2 may have an active surface having a semiconductor structure formed thereon and an inactive surface opposite to the active surface (in a thickness direction of the first and second substrates S1 and S2). The active surfaces correspond to front-side surfaces of the first and second substrates S1 and S2, and the inactive surfaces correspond to back-side surfaces of the first and second substrates S1 and S2. According to an example embodiment, the first substrate S1 may include a first semiconductor structure 50 formed on the active surface thereof, and the second substrate S2 may include a second semiconductor structure 60 formed on the active surface thereof. For example, the first semiconductor structure 50 may include a first insulating layer S1 and a first conductive pattern 53, and the second semiconductor structure 60 may include a second insulating layer 61 and a second conductive pattern 63. The first insulating layer S1 and the second insulating layer 61 may include, for example, a silicon oxide ($SiO_2$). The first conductive pattern 53 and the second conductive pattern 63 may include, for example, copper (Cu).

The first and second substrates S1 and S2 may include, for example, silicon (S1). Alternatively, the first and second substrates S1 and S2 may include a semiconductor element such as germanium (Ge) or a compound semiconductor such as silicon carbide (SiC), gallium arsenide (GaAs), or indium phosphide (InP).

According to an example embodiment, the first and second semiconductor structures 50 and 60 may include a semiconductor device layer including a plurality of individual devices and a wiring structure layer electrically connecting the plurality of individual devices to each other.

The plurality of individual devices may be a volatile memory and/or a nonvolatile memory. The volatile memory may be, for example, dynamic random access memory (DRAM), static RAM (SRAM), or the like, and the nonvolatile memory may be, for example, a flash memory, magnetic RAM (MRAM), phase change RAM (PRAM), or the like. Alternatively, the first and second substrates S1 and S2 may include a logic chip, a system-on-chip (SOC), an application specific integrated circuit (ASIC), an image sensor chip, and the like. The wiring structure layer may include a metal wiring layer and/or a via plug. The wiring structure layer may be, for example, a multi-layer structure in which two or more metal wiring layers and/or two or more via plugs are alternately stacked.

According to an example embodiment, the first substrate S1 may be a wafer including a logic chip, and the second substrate S2 may be a wafer including a memory chip. Alternatively, the first substrate S1 may be a wafer including a logic chip, and the second substrate S2 may be a wafer including an image sensor chip.

Referring to FIGS. 11 and 12B, in operation S220, the first substrate S1 is bonded to the second substrate S2. The first bonding chuck 200 and the second bonding chuck 300 may perform align bonding such that the first substrate S1 is bonded to the second substrate S2. When the first substrate S1 is bonded to the second substrate S2, the first conductive pattern 53 of the first semiconductor structure 50 comes in contact with the second conductive pattern 63 of the second semiconductor structure 60. For example, the first substrate S1 and the second substrate S2 may be bonded by using the substrate bonding apparatus 1 or 1a described above with reference to FIG. 9 or 10 and may also be performed by the substrate bonding method described with reference to FIGS. 1 and 2A to 2G.

According to an example embodiment, each of the first bonding surface 55 of the first substrate S1 and the second bonding surface 65 of the second substrate S2 may have a plasma-treated or wet-treated surface so as to have an adhesive force for forming initial adhesion between the first substrate S1 and the second substrate S2 in a bonding process. For example, each of the first insulating layer S1 of the first semiconductor structure 50 and the second insulating layer 61 of the second semiconductor structure 60 may have the plasma-treated or wet-treated surface. For example, because an —OH functional group is attached to the surfaces of the first insulating layer S1 and the second insulating layer 61, when the first substrate S1 is bonded to the second substrate S2, the —OH functional group of the first insulating layer S1 and the —OH functional group of the second insulating layer 61 may be spontaneously bonded to each other through hydrogen bond.

Referring to FIG. 11, when the bonding between the first substrate S1 and the second substrate S2 using the substrate bonding apparatus 1 (or 1a) is completed, annealing on the bonded first substrate S1 and second substrate S2 is performed so as to improve a bonding strength between the first substrate S1 and the second substrate S2 in operation S230. Based on the annealing process, the first conductive pattern 53 of the first semiconductor structure 50 and the second conductive pattern 63 of the second semiconductor structure 60 may be bonded, and the first insulating layer S1 of the first semiconductor structure 50 and the second insulating layer 61 of the second semiconductor structure 60 may be bonded.

Referring to FIG. 11, in operation S240, a post process on the bonded substrate is performed. Here, the post process may include various semiconductor processes. For example, the post process may include a deposition process, an etching process, an ionization process, a cleansing process, and the like. Herein, the deposition process may include various physical layer formation processes such as chemical vapor deposition (CVD), sputtering, and spin coating. The ionization process may include ion injection, propagation, annealing, and the like. By performing the post process, integrated circuits and wirings constituting the semiconductor device may be formed.

The post process may include a packaging process of mounting the semiconductor device on a printed circuit board and forming a molding layer. In addition, the post process may include a test process of testing the semiconductor device or a semiconductor package. By performing the post process, the semiconductor device or the semiconductor package may be manufactured.

While example embodiments have been particularly shown and described, it will be understood that various changes in form and details may be made therein without departing from the spirit and scope of the following claims.

What is claimed is:

1. A substrate bonding apparatus for bonding a first substrate to a second substrate, the substrate bonding apparatus comprising:
a first bonding chuck comprising:
a first base;
a first deformable plate provided on the first base to support the first substrate;
a first pneumatic adjustor configured to deform the first deformable plate by adjusting a first pressure in a first cavity formed between the first deformable plate and the first base; and
a first sensor configured to generate a signal that varies according to a first distance between the first base and the first deformable plate;
a second bonding chuck comprising:
a second base;
a second deformable plate provided on the second base to support the second substrate; and
a second pneumatic adjustor configured to deform the second deformable plate by adjusting a second pressure in a second cavity formed between the second deformable plate and the second base; and
a controller configured to control, based on the signal, each of the first pneumatic adjustor and the second pneumatic adjustor to symmetrically deform the first deformable plate and the second deformable plate,
wherein the first deformable plate is deformed such the first distance is varied based on the first pressure, and the second deformable plate is deformed such that a second distance between the second base the second deformable plate is varied based on the second pressure.

2. The substrate bonding apparatus of claim 1, wherein the first bonding chuck further comprises a first vacuum pump configured to provide a first adsorption force for vacuum-adsorbing the first substrate on the first deformable plate, and
the second bonding chuck further comprises a second vacuum pump configured to provide a second adsorption force for vacuum-adsorbing the second substrate on the second deformable plate.

3. The substrate bonding apparatus of claim 1, wherein the first bonding chuck further comprises a first vacuum pump configured to independently adjust a first central adsorption force applied to a first central area of the first substrate and a first peripheral adsorption force applied to a first peripheral area of the first substrate, and
the second bonding chuck further comprises a second vacuum pump configured to independently adjust a second central adsorption force applied to a second central area of the second substrate and a second peripheral adsorption force applied to a second peripheral area of the second substrate.

4. The substrate bonding apparatus of claim 3, wherein the first deformable plate comprises a first partition partitioning a first inner space corresponding to the first central area of the first substrate and a first outer space corresponding to the first peripheral area of the first substrate along a radial direction of the first deformable plate, and
the second deformable plate comprises a second partition partitioning a second inner space corresponding to the second central area of the second substrate and a second outer space corresponding to the second peripheral area of the second substrate.

5. The substrate bonding apparatus of claim 3, wherein, the controller is further configured to, while a bonding area between the first substrate and the second substrate is being propagated within the first central area and the second central area:
control the first vacuum pump to terminate vacuum adsorption for the first central area of the first substrate and vacuum-adsorb the first peripheral area of the first substrate, and
control the second vacuum pump to terminate vacuum adsorption for the second central area of the second substrate and vacuum-adsorb the second peripheral area of the second substrate.

6. The substrate bonding apparatus of claim 3, wherein, the controller is further configured to, when the first peripheral area of the first substrate is bonded to the second peripheral area of the second substrate:
control the first vacuum pump to terminate vacuum adsorption for the first peripheral area of the first substrate and vacuum-adsorb the first central area of the first substrate, and
control the second vacuum pump to terminate vacuum adsorption for the second peripheral area of the second substrate and vacuum-adsorb the second central area of the second substrate.

7. The substrate bonding apparatus in claim 1, wherein, while the first substrate is being bonded to the second substrate, the first deformable plate and the second deformable plate are deformed symmetrically to each other.

8. The substrate bonding apparatus of claim 1, further comprising a plurality of additional sensors arranged in a radial direction on at least one of the first bonding chuck or the second bonding chuck,
wherein each of the plurality of additional sensors is configured to measure a vertical-direction displacement of at least one of the first deformable plate and the second deformable plate.

9. The substrate bonding apparatus of claim 1, wherein each of the first deformable plate and the second deformable plate comprises a plurality of first ribs radially extending on a surface thereof.

10. The substrate bonding apparatus of claim 1, wherein the controller comprises a computer.

11. The substrate bonding apparatus of claim 1, wherein each of the first deformable plate and the second deformable plate comprises a plurality of second ribs arranged in a concentric form on a surface thereof.

12. A substrate bonding apparatus for bonding a first substrate to a second substrate, the substrate bonding apparatus comprising:
a first bonding chuck comprising:
a first base;
a first deformable plate provided on the first base, the first deformable plate being configured to deform the first substrate by being deformed while supporting the first substrate; and
a first sensor configured to generate a signal that varies according to a first distance between the first base and the first deformable plate;
a second bonding chuck comprising:
a second base; and
a second deformable plate provided on the second base, the second deformable plate being configured to deform the second substrate by being deformed while supporting the second substrate; and
a controller configured to control, based on the signal, each of the first bonding chuck and the second bonding chuck to symmetrically deform the first deformable plate and the second deformable plate, wherein the first deformable plate comprises a first partition separating a first inner space corresponding to a first central area of the first substrate from a first outer space corresponding to a first peripheral area of the first substrate, the second deformable plate comprises a second partition separating a second inner space corresponding to a second central area of the second substrate from a second outer space corresponding to a second peripheral area of the second substrate, the first bonding chuck is configured to independently adjust a first adsorption force to be applied to the first central area and the first peripheral area of the first substrate, and the second bonding chuck is configured to independently adjust a second adsorption force to be applied to the second central area and the second peripheral area of the second substrate.

13. The substrate bonding apparatus of claim 12, wherein the first bonding chuck further comprises a first pneumatic adjustor configured to deform the first deformable plate by adjusting pneumatic pressure in a first cavity formed between the first deformable plate and the first base, and the second bonding chuck further comprises a second pneumatic adjustor configured to deform the second deformable plate by adjusting pneumatic pressure in a second cavity formed between the second deformable plate and the second base.

14. The substrate bonding apparatus of claim 13, wherein the controller is further configured to control driving of the first pneumatic adjustor and the second pneumatic adjustor such that the first deformable plate and the second deformable plate are deformed symmetrically to each other while the first substrate and the second substrate are bonded to each other.

15. The substrate bonding apparatus of claim 13, wherein the first bonding chuck further comprises a first sealing material configured to be elongated and shortened between the first deformable plate and the first base and configured to seal the first cavity, the first sealing material including a first passage communicating with a hole of the first deformable plate and a hole of the first base, the first passage of the first sealing material separated from the first cavity, and the second bonding chuck further comprises a second sealing material configured to be elongated and shortened between the second deformable plate and the second base and configured to seal the second cavity, the second sealing material including a second passage communicating with a hole of the second deformable plate and a hole of the second base, the second passage of the second sealing material separated from the second cavity.

16. The substrate bonding apparatus of claim 12, wherein the first bonding chuck further comprises a first push rod configured to deform the first deformable plate by physically pressing the first deformable plate, the second bonding chuck further comprises a second push rod configured to deform the second deformable plate by physically pressing the second deformable plate, and the controller is further configured to control driving of the first push rod and the second push rod such that the first deformable plate and the second deformable plate are deformed symmetrically to each other while the first substrate and the second substrate are bonded to each other.

17. The substrate bonding apparatus of claim 12, wherein the first bonding chuck and the second bonding chuck face each other in a vertical direction, and the substrate bonding apparatus further comprises a chuck movement mechanism configured to adjust a distance between the first bonding chuck and the second bonding chuck.

18. The substrate bonding apparatus of claim 12, wherein the second bonding chuck further comprises a bonding propagation detector comprising a plurality of additional sensors arranged in a radial direction, and each of the plurality of additional sensors included in the second bonding chuck is configured to measure a displacement of the second deformable plate.

19. A substrate bonding apparatus for bonding a first substrate to a second substrate comprising:
a controller;
a first bonding chuck comprising:
a first base;
a first deformable plate provided on the first base to support the first substrate; and
a sensor configured to generate a signal that varies according to a first distance between the first base and the first deformable plate; and
a second bonding chuck comprising:
a second base; and
a second deformable plate provided on the second base to support the second substrate,
wherein the first bonding chuck further comprises a first push rod configured to deform the first deformable plate by physically pressing the first deformable plate,
the second bonding chuck further comprises a second push rod configured to deform the second deformable plate by physically pressing the second deformable plate, and
the controller is configured to control, based on the signal, the first push rod and the second push rod to symmetrically deform the first deformable plate and the second deformable plate.

20. The substrate bonding apparatus of claim 19, wherein the first deformable plate comprises a first convex surface part provided at a first portion with which the first push rod comes in contact, and the second deformable plate comprises a second convex surface part provided at a second portion with which the second push rod comes in contact.

* * * * *